(12) United States Patent
Shintate (10) Patent No.: US 7,793,411 B2
(45) Date of Patent: Sep. 14, 2010

(54) METHOD FOR MANUFACTURING ELECTRONIC SUBSTRATE

(75) Inventor: Tsuyoshi Shintate, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 114 days.

(21) Appl. No.: 11/935,908

(22) Filed: Nov. 6, 2007

(65) Prior Publication Data
US 2008/0104832 A1    May 8, 2008

(30) Foreign Application Priority Data
Nov. 7, 2006    (JP)    ............... 2006-301234

(51) Int. Cl.
*H05K 3/30*    (2006.01)
*H01L 21/00*    (2006.01)

(52) U.S. Cl. .............. 29/832; 29/830; 29/840; 438/30; 438/31; 438/674

(58) Field of Classification Search .......... 29/825, 29/830, 932, 940; 438/30, 31, 674
See application file for complete search history.

(56) References Cited

U.S. PATENT DOCUMENTS

| 5,136,365 | A | * | 8/1992 | Pennisi et al. | 257/783 |
| 5,784,780 | A | * | 7/1998 | Loo | 29/840 |
| 6,171,468 | B1 | * | 1/2001 | Thorn et al. | 205/118 |
| 6,503,831 | B2 | * | 1/2003 | Speakman | 438/674 |
| 7,394,106 | B2 | * | 7/2008 | Suzuki | 257/98 |
| 2003/0108664 | A1 | * | 6/2003 | Kodas et al. | 427/125 |
| 2006/0166411 | A1 | * | 7/2006 | Morisue et al. | 438/149 |
| 2006/0263930 | A1 | * | 11/2006 | Ito | 438/106 |
| 2007/0062723 | A1 | * | 3/2007 | Kim et al. | 174/255 |

FOREIGN PATENT DOCUMENTS

JP    03-069191    3/1991

OTHER PUBLICATIONS

A Flexible Method for Applying Adhesives to Printeds Circuit Boards by Richard R. Lathrop, Jr, Adhesives Age, Dec. 1998 41, 12 p. 22.*

* cited by examiner

*Primary Examiner*—C. J Arbes
(74) *Attorney, Agent, or Firm*—Workman Nydegger (57) ABSTRACT

A method for manufacturing an electronic substrate including an electronic component bonded with adhesive to a base part, comprises (a) applying a droplet containing the adhesive to an area on the base part, the area facing to the electronic component, within a range substantially equal to a size of the electronic component by using a droplet ejection head moving in relatively to the base part, and (b) mounting the electronic component on the adhesive applied to the base part.

8 Claims, 5 Drawing Sheets

METHOD FOR MANUFACTURING ELECTRONIC SUBSTRATE

BACKGROUND OF THE INVENTION

1. Technical Field

The present invention relates to a method for manufacturing an electronic substrate.

2. Related Art

As electronic substrates grow more sophisticated and smaller, the demand for more integration and more functionality of electronic substrates mounted with electronic components such as IC chips has become stronger in recent years.

JA-A-3-69191 is an example of related art, in which an electronic substrate is manufactured by mounting electronic components on copper wirings formed on a substrate member, coating a surface with resins at once to constitute an electronic component buried layer, and then laminating the thusly achieved electronic component buried layer using an adhesive.

The related art such as described above, however, has a following problem.

The above electronic component is generally secured with adhesive to a base part on which the electronic component is to be mounted. This adhesive is applied by, for example, a dispenser, in drops to a plurality of areas in regions on the base part, the regions to be mounted with the electronic components. However, where the electronic components are mounted on the adhesive applied in this manner, the adhesive spreads but not enough to fill out each space between the electronic components and the base part, thereby causing gaps therebetween in many cases.

In this case, there is a problem in that air remaining in the gaps may expand during heating for curing the adhesive, thereby causing cracks in the cured adhesive, which decrease adhesive strength.

SUMMARY

An advantage of the present invention is to provide a method for manufacturing an electronic substrate, by which electronic components are stably mounted and secured.

According to an aspect of the invention, a method for manufacturing an electronic substrate including an electronic component bonded with adhesive to a base part, the method includes (a) applying a droplet containing the adhesive to an area on the base part, the area facing to the electronic component, within a range substantially equal to a size of the electronic component by using a droplet ejection head moving in relatively to the base part, and (b) mounting the electronic component on the adhesive applied to the base part.

In this manner, the droplet containing the adhesive is applied to an area on the base part, within a range substantially equal to a size of the electronic component, thereby preventing air from being trapped between the mounted electronic component and the base part. It is therefore possible to prevent cracks from appearing due to expansion of the air or the like even in the case of heat application for the purpose of curing the adhesive. Thus, the electronic component maintains stable adhesive strength.

In this manner, the droplet containing the adhesive is applied by a droplet ejection system, which makes it easy to pattern the adhesive without use of a mask or a photoresist, which is used in a printing method or a photolithographic method, and prevents the adhesive from being wasted, thereby being able to contribute to reduced cost.

In the above-mentioned method, it is preferable that the applied adhesive be brought in a half-cured state before the step (b).

In this manner, the electronic component is easily mounted on the adhesive in a half-cured state, thereby bringing the electronic component into intimate contact with the adhesive, leading to improvement in adhesiveness. The electronic component is buried in the adhesive depending on viscosity of the applied adhesive or pressure for mounting the electronic component. Thus, side surfaces of the electronic component are brought into intimate contact with the adhesive to enhance adhesion strength. Furthermore, in the case where the adhesive contracts by heat, the contraction force functions as force for holding the electronic component, thereby enhancing more adhesion strength.

In the above-mentioned method, it is preferable that a smaller amount of energy than that required to cure the droplet containing the adhesive be applied in the step (c) and that energy in the amount required to cure the droplet containing the adhesive be applied after the step (b).

In this manner, it is preferable that at least one of light energy and heat energy be applied to the droplet containing the adhesive.

In the above-mentioned method, the applied adhesive is brought in a half-cured state by applying the smaller amount energy than that required to cure the droplet containing the adhesive. Furthermore, the electronic component is secured to the base part by curing the adhesive by applying extra energy after mounting the electronic component on the adhesive.

In the above-mentioned method, it is preferable that the base part be made from insulating material and that the adhesive be defined as the insulating material.

In this manner, the base part and the adhesive are made from the same material to reduce varieties of materials to be use, thereby being able to contribute to improvement in manufacturing efficiency.

In the above-mentioned method, it is preferable that the electronic substrate include a conductive wiring electrically connected to the electronic component and that the adhesive contain material for the conductive wiring.

In this manner, the conductive wiring and the adhesive are made from the same material to reduce varieties of materials to be use, thereby being able to contribute to improvement in manufacturing efficiency. In this manner, it is preferable that the pluralities of conductive wirings be laminated with an insulating layer intervened.

In this manner, the above-mentioned method contributes to improvement in manufacturing efficiency even in the case of manufacturing a so-called multilayer wiring substrate.

In the above-mentioned method, it is preferable that the conductive wiring and the insulating layer be formed using the droplet ejection head.

In this manner, the multilayer wiring substrate is manufactured by forming films using the droplet ejection head only, thereby being able to contribute to improvement in manufacturing efficiency.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of a method for manufacturing an electronic substrate in accordance with this embodiment will be explained with reference to FIGS. 1 to 5C.

Each element is set in a recognizable size by changing a reduction scale as needed in each drawing referenced below.

Droplet Ejection Device

Figure 1:
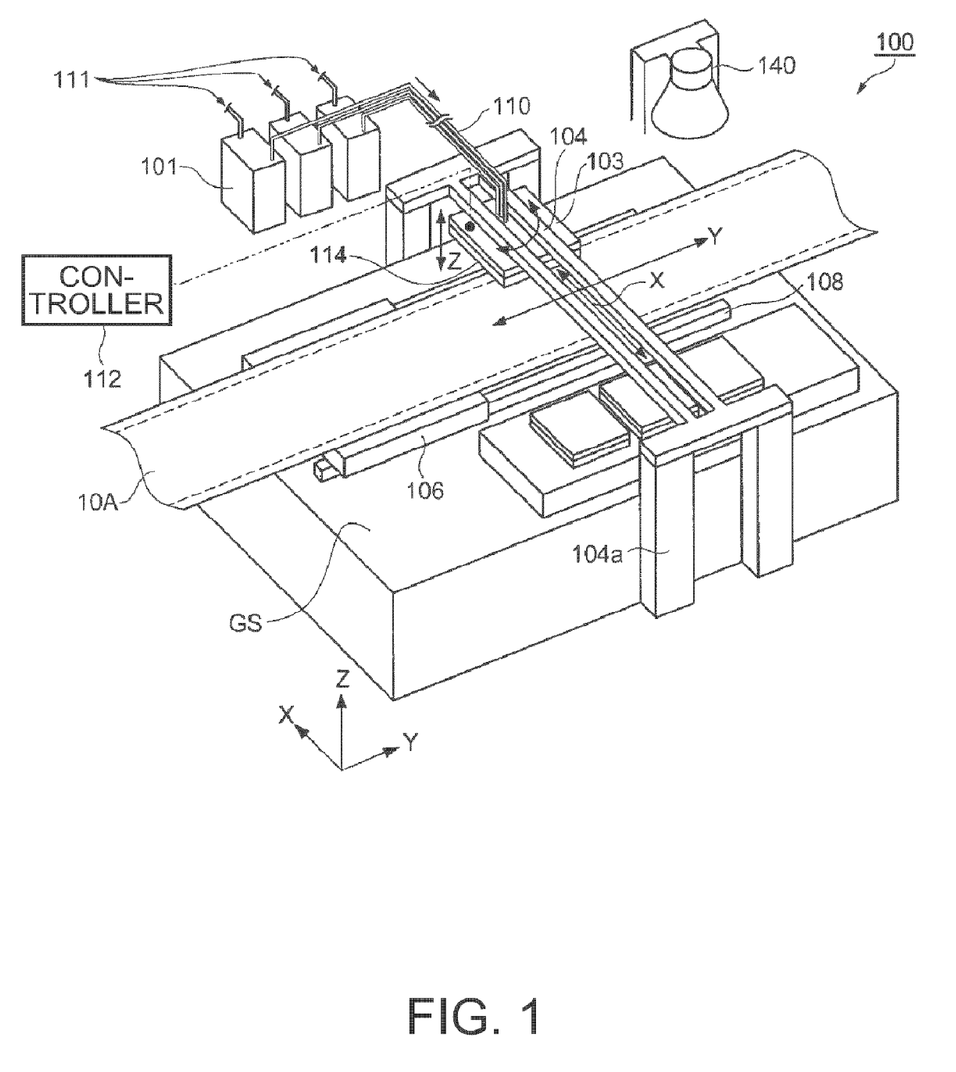
FIG. 1 is a schematic view of a droplet ejection device used in manufacturing of an electronic substrate.
Figure 2A:
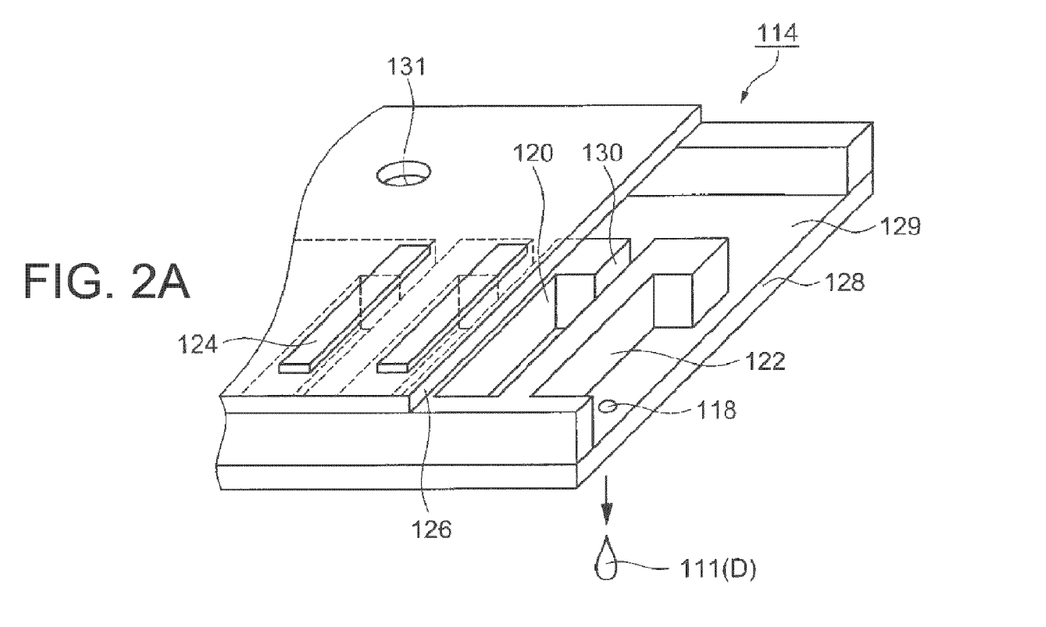
FIG. 2A is a schematic view of a head of the droplet ejection device.
Figure 2B:
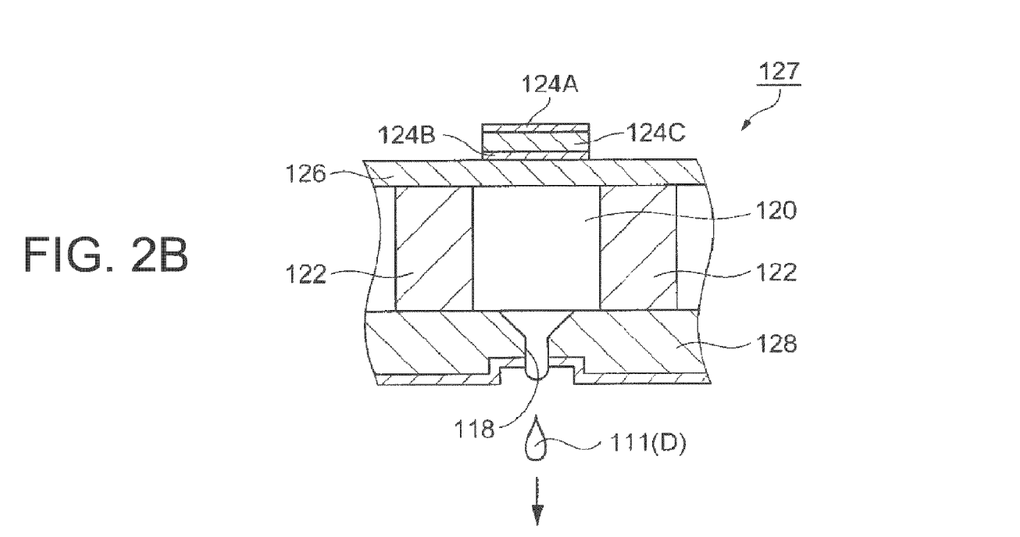
FIG. 2B is a schematic view of the head of the droplet ejection device.

First described is a droplet ejection device used in the method for manufacturing the electric substrate in accordance with this invention, with reference to FIGS. 1 to 2B.

A droplet ejection device 1 shown in FIG. 1 is basically an inkjet device. To be more specific, the droplet ejection device 1 includes tanks 101 holding fluid material 111, tubes 110, a ground stage GS, an ejection head unit (a droplet ejection head unit) 103, a stage 106, a first position controller 104, a second position controller 108, a controller 112, a light irradiation device 140, and supporters 104a.

The ejection head unit 103 holds a head 114 shown in FIG. 2A. The head 114 ejects droplets of the fluid material 111 according to signals from the controller 112. The head 114 of the ejection head unit 103 is connected to the tanks 101 via the tubes 110 so that the tanks 101 provide the head 114 with the fluid material 111.

The stage 106 provides a flat surface for securing a substrate to be described later. The stage 106 further has the function of securing a position of the substrate using attraction force.

The first position controller 104 is secured by the supporters 104a at a predetermined height from the ground stage GS. This first position controller 104 has the function of moving the ejection head unit 103 in directions of an X axis and a Z axis orthogonal to the X axis according to signals from the controller 112. The first position controller 104 has the function of rotating the ejection head unit 103 around an axis parallel to the Z axis. In this embodiment, the Z axis direction is parallel to a vertical direction, i.e., a gravitational acceleration direction.

The second position controller 108 moves the stage 106 in a direction of a Y axis on the ground stage GS, according to signals from the controller 112. The Y axis direction is set as a direction orthogonal to both directions of the X axis and the Z axis.

As described above, the ejection head unit 103 is moved in the X axis direction by the first position controller device 104. The substrate is moved together with the stage 106 in the Y axis direction by the second position controller 108. As a result, a position of the head 114 is changed in relatively to the substrate. To be more specific, according to these movements described above, the ejection head unit 103, the head 114, or a nozzle 118 shown in FIGS. 2A and 2B relatively moves, i.e., scans the substrate in the directions of the X axis and the Y axis keeping a predetermined distance from the substrate in the Z direction. "Relative movement" or "relative scanning" means that at least one of a side for ejecting the fluid material 11 and a side attached with the ejected material, i.e., a workpiece, is moved in relatively to the other.

The controller 112 receives ejection data from an external information processing apparatus, the ejection data describing a relative position to which the droplet of the fluid material 111 is to be ejected. The controller 112 stores the received ejection data into a memory device while controlling the first position controller 104, the second position controller 108, and the head 114, based on the stored ejection data. The ejection data is defined as data for providing a top surface of the substrate with the fluid material 111 in a predetermined pattern. In this embodiment, the ejection data is defined as bitmap data.

The droplet ejection device 1 thus structured moves the nozzle 118 of the head 114, shown in FIG. 2A, in relatively to the substrate based on the ejection data while ejecting the fluid material 111 through the nozzle 118 to the workpiece. The relative movement of the head 114 and the ejection of the fluid material 111 from the head 114 by the droplet ejection device 1 are collectively described as "application scanning" or "ejection scanning" sometimes.

The light irradiation device 140 irradiates the fluid material 111 attached to the substrate with ultraviolet light. The controller 112 controls on/off ultraviolet light irradiation of the light irradiation device 140.

As shown in FIGS. 2A and 2B, the head 114 of the droplet ejection device 1 is an inkjet head having the plurality of nozzles 118. To be more specific, the head 114 includes a vibration plate 126, the plurality of nozzles 118, and a nozzle plate 128 which forms each of openings of the nozzles, a reservoir 129, a plurality of partition walls 122, a plurality of cavities 120, and a plurality of oscillators 124.

The reservoir 129, which is placed between the vibrating plate 126 and the nozzle plate 128, is consistently filled with the fluid material 111 supplied from exterior tanks, not shown, through a hole 131. The plurality of partition walls 122 are located between the vibrating plate 126 and the nozzle plate 128.

Each of the cavities 120 is a part surrounded by the vibration plate 126, the nozzle plate 128, and a pair of partition walls 122. The cavities 120 are formed in a manner to correspond to the nozzles 118, so that the cavities 120 and the nozzles 118 are in equal numbers. Each of the cavities 120 is supplied with the fluid material 111 from the reservoir 129 through a supply opening 130 placed between the pair of partition walls 122. In this embodiment, the nozzle 118 is 27 µm in diameter, for example.

The plurality of oscillators 124 are placed on the vibrating plate 126 in a manner to correspond to the cavities 120, respectively. Each of the oscillators 124 includes a piezo element 124C and a pair of electrodes 124A, 124B sandwiching the piezo element 124C therebetween. The controller 112 applies driving voltage between the pair of electrodes 124A, 124B so that the corresponding nozzle 118 ejects droplet D of the fluid material 111. At this point, the volume of material ejected through the nozzle 118 is variable in a range between 0 pl and 42 pl (picoliter). A shape of the nozzle 118 is adjusted so that droplets of the fluid material 111 are ejected through the nozzle 118 in the Z axis direction.

An ejection unit 127 may have an electrothermal conversion element instead of a piezo element. In other words, the ejection unit 127 may adopt a structure in which the material is ejected utilizing thermal expansion of the material using the electrothermal conversion element.

Method for Manufacturing Electronic Substrate

Next, the steps for securing the electronic component to the base part in the steps for manufacturing the electronic substrate using the above droplet ejection device 1 are described first.

Figure 3A:
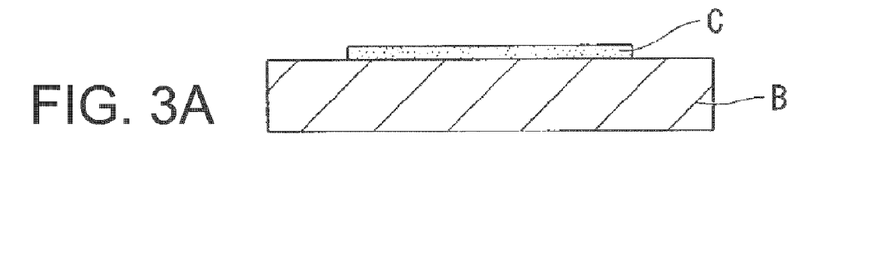
FIG. 3A is a process drawing for showing a method for manufacturing an electronic substrate according to this invention.

FIGS. 3A to 3D are each a process drawing showing the method for manufacturing the electronic substrate. As shown in FIG. 3A, droplet C containing the adhesive, which is simply referred to as adhesive C hereinafter, is applied to a base part B through the head 114 of the droplet ejection device 1 in an application step.

The adhesive C is applied to an area on the base part B, the area facing to an electronic component P to be mounted on the base part B in a later step, the area being within a range substantially equal to a size of the electronic component P, shown in FIG. 3C.

The base part B used in this case may be a substrate such as a glass substrate or a semiconductor substrate or an insulating film formed on the substrate. The adhesive C used in this case contains an acrylic photopolymer as material having a light-curable property and a heat-curable property so the adhesive C as to be cured upon application of light energy and heat energy.

This light-curable material may contain solvent and resins dissolved in the solvent. The light-curable material may contain photosensitive resins that are exposed to light to increase the polymerization degree or may contain resins and photopolymerization initiator for initiating curing of the resins. As a light-curable material, the adhesive C may contain monomers that are photopolymerized to form insoluble insulating resins and photopolymerization initiator for initiating photopolymerization of the monomers. The light-curable material in this case does not have to contain the photopolymerization initiator as long as the monomers have a fluorescence function.

Figure 3B:
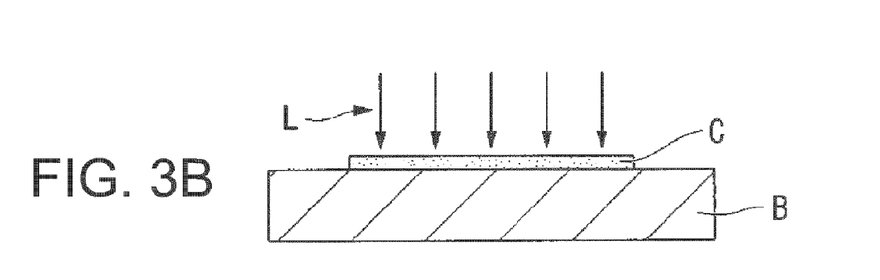
FIG. 3B is the process drawing for showing the method for manufacturing the electronic substrate according to this invention.

Subsequently, as shown in FIG. 3B, the applied adhesive C is irradiated with light L with an ultraviolet wavelength for a predetermined time period and thus receives the predetermined amount of energy, thereby being brought into a half-cured state during a half-curing step. At this point, the amount of energy applied to the adhesive C is set smaller than that required to cure the adhesive C.

In this embodiment, a wavelength of the light with which the adhesive C is irradiated is set to 365 nm, for example.

Herein, the adhesive C in a half-cured state means that the light-curable material contained in the adhesive C is set between a state at the time of ejection and a completely cured state. In this embodiment, such an intermediate state is set to the above half-cured state. The state at the time of ejection indicates a state where the light-curable material is viscous enough to be ejected through the nozzle 188.

Figure 3C:
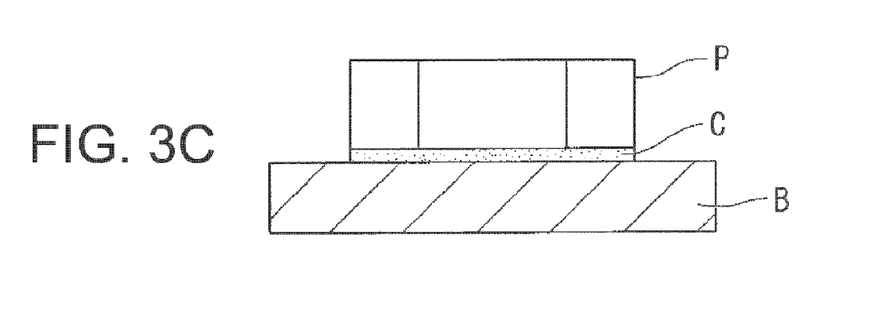
FIG. 3C is the process drawing for showing the method for manufacturing the electronic substrate according to this invention.
Figure 3D:
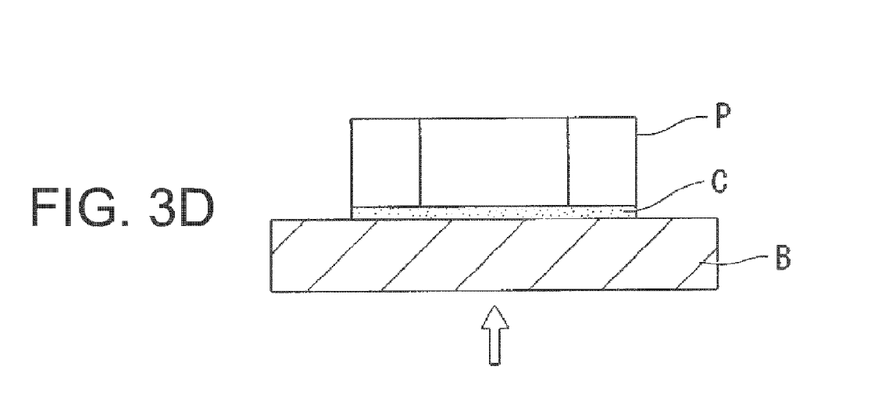
FIG. 3D is the process drawing for showing the method for manufacturing the electronic substrate according to this invention.

Next, as shown in FIG. 3C, the electronic component P is placed/mounted on the adhesive C in a half-cured state in a mounting step. The electronic component P is mounted using a mounter or the like. The electronic component P may be just placed or may be mounted with application of pressure on the adhesive C. In the case of mounting with pressure, the electronic component P is buried in the adhesive C to increase a contact area therebetween, thereby making it easier to secure the electronic component P.

In either mounting way, the adhesive C in a half-cured state is soft enough to spread over a bottom surface, i.e., a contact surface of the electronic component P to the adhesive C even where the contact surface is in an uneven state exhibiting poor flatness, so that the contact area is increased to enhance adhesiveness.

Subsequently, as shown in FIG. 3B, heat energy is applied to the adhesive C by heating from a side of the base part B. The amount of this energy is set to that required to cure the adhesive C in a half-cured state. This heating process uses, for example, a clean oven, achieving heat application at 150 degrees Celsius for 60 minutes. With this heat application, polymerization reaction of resins in the adhesive C is further advanced, so that the resins are cured. As a result, the adhesive C becomes a joining layer positioned between the electronic component P and the base part B made of insulating material.

Method for Manufacturing Multilayer Wiring Substrate

Next, a method for manufacturing a multilayer wiring substrate adopting the method for manufacturing the electronic substrate described above will be described with reference to FIGS. 4A and 5C.

Figure 4A:
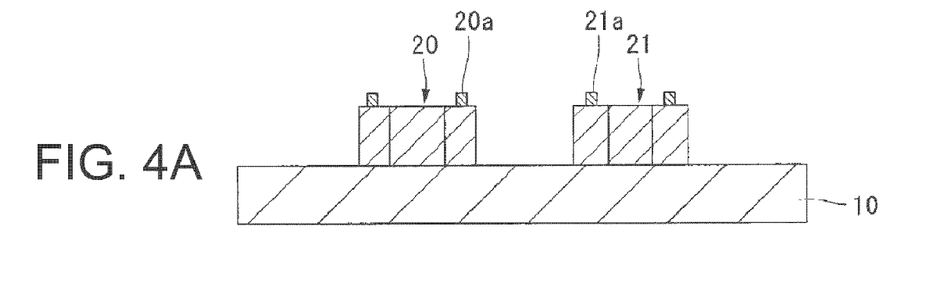
FIG. 4A is a view showing a step of manufacturing the multilayer wiring substrate.

Herein, such an example case is described, in which the IC chip as the electronic component is mounted on the insulating layer functioning as the base part.

As shown in FIG. 4A, chip components 20, 21 are arranged on a base material 10 made from silicon. At this point, backsides of the chip components 20, 21 are provided with an adhesive tape, for example, with which the chip components 20, 21 are secured onto the base material 10. As the base material on which the chip components 20, 21 are arranged, various types of material can be designated other than silicon, such as glass, quartz glass, and a metal plate. Furthermore, the base material includes a substrate made from material designated above, with a surface provided with a foundation layer such as a semiconductor film, a metal film, an insulating film, an organic film, or the like.

As the chip components, 20, 21, a resistor, a capacitor, an IC chip, and the like are designated. In this embodiment, a resistor was used as the chip component 20 while a capacitor was used as the chip component 21. The chip components 20, 21 are arranged on the base material 10 in a manner such that electrode parts 20a, 21a are directed upward.

The electrode parts 20a, 21a are flush with top surfaces of the chip components 20, 21 in reality but are illustrated in a projecting manner. Alternatively, the electrode parts 20a, 21a may be formed in a projecting manner in reality using the droplet ejection system to eject conductive ink.

Figure 4B:
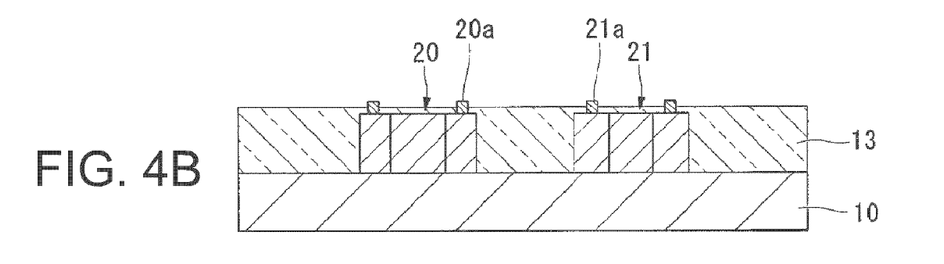
FIG. 4B is a view showing a step of manufacturing the multilayer wiring substrate.

Subsequently, insulating ink, i.e., the insulating material, is cured after being applied to surroundings of the chip components 20, 21 in a manner to have the substantially same height as that of the chip components 20, 21 using the droplet ejection system by the droplet ejection device 1. In this manner, the insulating film is formed.

As the insulating ink, fluid material such as that becoming $SiO_2$, $SiN$, or $Si3N_4$ after drying, a polyimide resin system, an epoxy resin, a polyester resin, a phenol resin, a fluorine resin, an ultraviolet curable resin, or the like is used. In this embodiment, used as the insulating ink is, for example, such that polyimide is diluted with solvent (N-methyl-2-pyrrolidone) and adjusted in a manner to set viscosity to 20 [mPa·s].

The chip components 20, 21 are buried in the insulating film 13, which is formed by curing the insulating ink, so that the electrode parts 20a, 21a are projecting as shown in FIG. 4B.

Figure 4C:
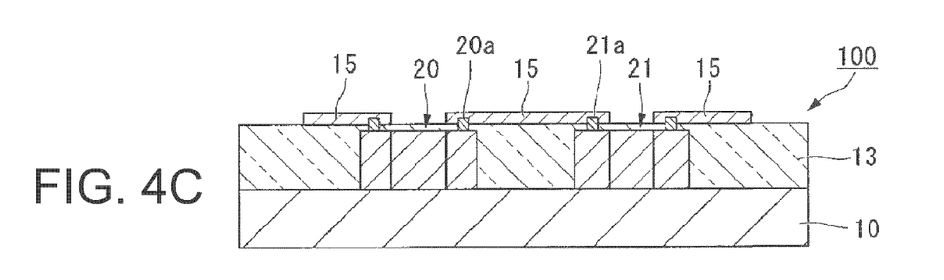
FIG. 4C is a view showing a step of manufacturing the multilayer wiring substrate.

Subsequently, wiring is carried out on the insulating film 13, the wiring being connected to the electrode parts 20a, 21a. In this embodiment, in a manner similar to the adhesive C and the insulating film 13, the wiring is carried out by the droplet ejection system using the droplet ejection device 1 which ejects the conductive ink.

In this embodiment, used as the conductive ink is such that a dispersion medium of silver-particle-dispersed liquid that silver particles with diameter of 10 nm are dispersed in organic solvent is diluted by substitution with tetradecane to be adjusted in a manner to set a concentration, a viscosity, and surface tension to 60 wt %, 8 m Pa·s, and 0.022 N/m, respectively.

To be more specific, the conductive ink is ejected and burned on the electrode parts 20a, 21a of the chip components 20, 21, thereby resulting in formation of an Ag wiring (a conductive wiring) 15 connected electrically to the chip components 20, 21.

The above dispersion medium is not particularly limited as long as the silver particles can be dispersed and prevented from coagulating. Other than water, cited as an example is an alcohol such as methanol, ethanol, propanol, or butanol, a hydrocarbon compound such as n-heptane, n-octane, decane, dodecane, tetradecane, toluene, xylene, cymene, durene, indene, dipentene, tetrahydronaphthalene, decahydronaphthalene, or cyclohexylbenzene, an ether compound such as ethylene glycol dimethyl ether, ethylene glycol diethyl ether, ethylene glycol methylethyl ether, diethylene glycol dimethyl ether, diethylene glycol diethyl ether, diethylene glycol methylethyl ether, 1,2-dimethoxyethane, bis (2-methoxyethyl) ether, p-dioxane, or a polar compound such as propylene carbonate, ã-butyrolactone, N-methyl-2-pyrrolidone, dimethylformamide, dimethylsulfoxide, or cyclohexampme. Among these compounds as a dispersion medium, water, an alcohol, a hydrocarbon compound, and an ether compound are preferable and water and a hydrocarbon compound are more preferable in terms of dispersibility of particles, stability of dispersed liquid, and ease of application to the droplet ejection method, i.e., an inkjet method. Viscosity of the dispersed liquid is preferably set in a range between 1 mPa·s and 50 mPa·s. Where the fluid material is ejected in drops by the inkjet method, the surroundings of the nozzle are easily contaminated by the leaked ink in the case of using the dispersed liquid with viscosity of less than 1 m Pa·s while a nozzle hole is clogged with the ink frequently enough to cause problems with smooth ejection of the droplet in the case of using the dispersed liquid with viscosity of more than 50 m Pa·s.

In order to adjust surface tension, it is preferable to add a small amount of surface tension adjuster such as fluorine series, silicon series, or nonionic series into the dispersed liquid to the extent that a contact angle with respect to the substrate is not extremely reduced. The surface tension adjuster of nonionic series enhances wettability of the liquid with respect to the substrate to improve leveling of the film, thereby being effective in preventing fine asperities on the film. The surface tension adjuster may include an organic compound such as alcohol, ether, ester, or ketone, if necessary.

Through the above steps, a wiring substrate 100 is manufactured in which the electronic components 20, 21 are buried in the insulating film 13.

Figure 4D:
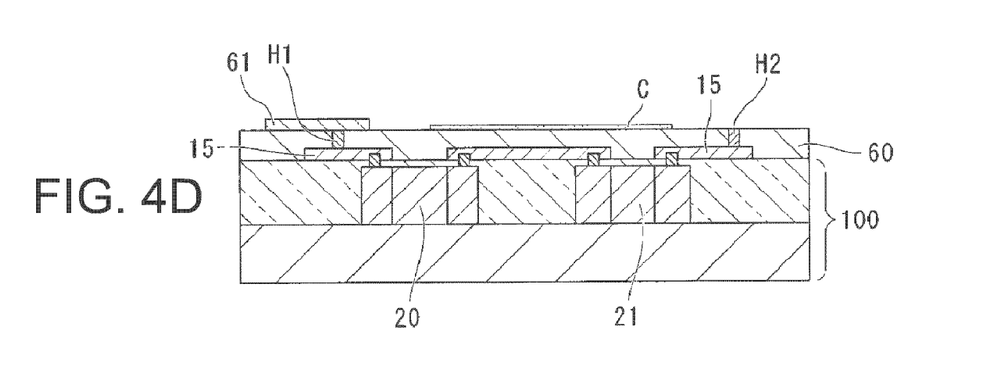
FIG. 4D is a view showing a step of manufacturing the multilayer wiring substrate.

As shown in FIG. 4D, a first interlayer insulating film 60 is formed on the wiring substrate 100. On the first interlayer insulating film 60, a first upper-layer wiring 61 is connected to the wiring 15 and the chip component 20 via a through-hole H1 while the adhesive C is applied to an area within a range substantially equal to a size of component chip 70 to be described later. In this embodiment, the same material as that of the insulating film 60, and insulating films 62, 64 to be described later is applied as the adhesive C.

All of the first interlayer insulating film 60, the through-hole H1, the first upper-layer wiring 61, and the adhesive C are formed by the droplet ejection system.

After application onto the first interlayer insulating film 60, the adhesive C is brought in a half-cured state by irradiation with ultraviolet light.

Figure 5A:
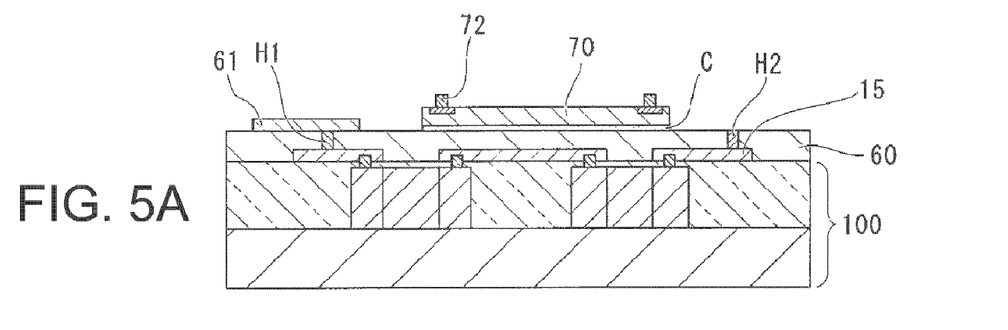
FIG. 5A is a view showing a step of manufacturing the multilayer wiring substrate.

As shown in FIG. 5A, the IC chip, i.e., electronic component 70 having a terminal 72 for external connection is thereafter mounted on the adhesive C and then the adhesive C is cured to secure the IC chip 70 by heating.

Figure 5B:
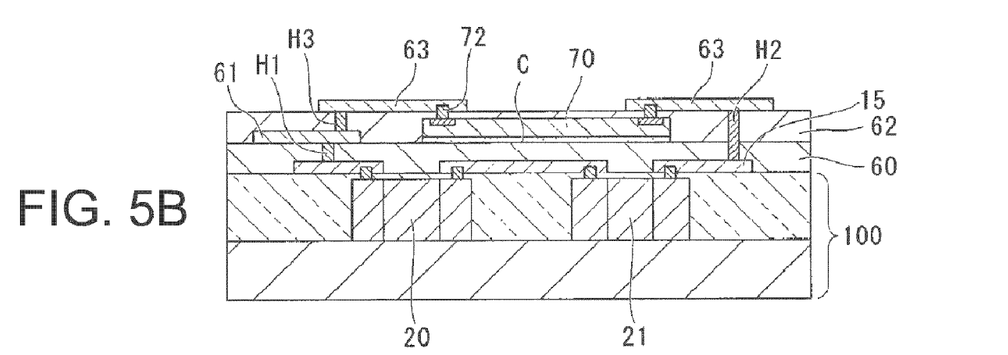
FIG. 5B is a view showing a step of manufacturing the multilayer wiring substrate.

As shown in FIG. 5B, a second interlayer insulating film, i.e., an insulating film 62 is subsequently formed by applying by the droplet ejection system and curing the insulating ink on the first interlayer insulating film 60 in a manner to cover the IC chip 70 and the wiring 61. At this point, the insulating ink is applied in a manner to surround the through-hole H2 connected to the wiring 15 and a through-hole H3 connected to the wiring 61.

In this manner, the IC chip 70 is buried in the second interlayer insulating film 62.

The through-holes H2, H3 are formed by applying the same material as that of the wirings 15, 61 by the droplet ejection system while a second upper-layer wiring 63 to be connected to the terminal 72 is formed by the droplet ejection system on the second interlayer insulating film 62. At this point, the wiring 63 is connected to each of the terminal 72 of the IC chip 70 and the through-holes H2, H3.

The second upper-layer wiring 63 is conducted to the first upper-layer wiring 61 via the through-hole H3 while being conducted to the Ag wiring 15 via the through-hole H2. Therefore, the IC chip 70 and the second upper-layer wiring 63 are well conducted to each other via the terminal 72.

Figure 5C:
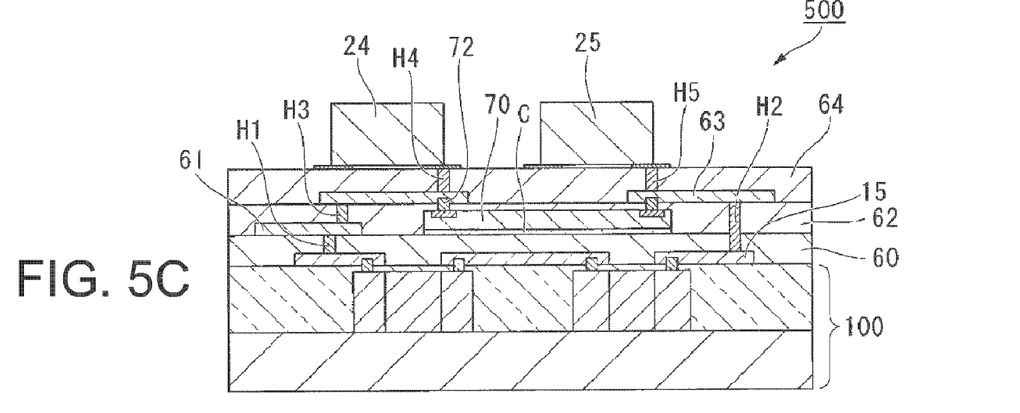
FIG. 5C is a view showing a step of manufacturing the multilayer wiring substrate.

As shown in FIG. 5C, a third interlayer insulating film 64 is formed on the second interlayer insulating film 62, and other chip components 24, 25 are installed on the third interlayer insulating film 64 with through-holes H4, H5 intervened therebetween. These through-holes H4, H5 are formed from the same material through the same steps as those of the through-holes H2, H3.

Herein, as the chip components 24, 25, an antenna element and a quartz crystal element are installed respectively.

A multilayer wiring substrate 500 is manufactured throughout the above steps.

As described above, in this embodiment, the electronic component P or the IC chip 70 is mounted after application of the adhesive C in a range substantially equal to a size of the electronic component C or the IC chip 70, thereby preventing air from being trapped between the electronic component and the base part B, i.e., the insulating film 60 in the case of the multilayer wiring substrate 500. Therefore, this embodiment prevents such a case that the air expands during heating and causes cracks in the cured adhesive C to decrease adhesive strength.

In this embodiment, the electronic component is mounted after bringing the adhesive C in a half-cured state, thereby improving adhesiveness even with the electronic component having a joining surface exhibiting poor flatness, so that the electronic component can be mounted and secured stably.

Especially in this embodiment, since the adhesive C is brought in a half-cured state by application of light energy, the process for bringing the adhesive C in a half-cured state is easily carried out while use of mask or the like makes it easy to designate a region to be irradiated with ultraviolet light.

Furthermore, in this embodiment, the adhesive C is made from the same material as that of the insulating films 60, 62, 64, thereby eliminating a necessity to prepare material for the adhesive C separately, which contributes to improvement in productivity. Furthermore, in this embodiment, the total steps for manufacturing the wiring substrate 100 and the multilayer wiring substrate 500 can be performed through the droplet ejection system, which achieves great improvement in productivity.

In this embodiment, furthermore, application of the liquid including the above adhesive in drops by the droplet ejection system makes it easy to pattern the adhesive without use of a mask or photoresist and prevents the adhesive from being wasted, thereby being able to contribute to reduced cost.

The preferred embodiment of the invention is described above but this invention is not limited to the above embodiment. Each of constructional elements described in the above embodiment is one example in terms of shape and combination and can be variously modified based on design requirement without departing from the scope of the invention.

For example, in the above embodiment, heat energy is applied to cure the adhesive in a half-cured state but light energy may be applied in the case where the base part B or the electronic component P allows ultraviolet light to pass therethrough.

In the above embodiment, the adhesive C is cured immediately after mounting the electronic component on the adhesive C in a half-cured state. However, in the case of manufacturing the multilayer wiring substrate 500, for example, the adhesive and the plurality of insulating films and conductive wirings are formed while the adhesive is in a half-cured state, and thereafter heating process is performed to cure the adhesive at once.

In the above embodiment, the adhesive C is made from the same material as that of the insulating films 60, 62, 64 but may be made from the same conductive material as that of the wirings 15, 61, 63, other than the insulating film, in the case where the conductive connecting part such as the electrode or the terminal is not arranged on the joining subject of the electronic component.

Furthermore, in the above embodiment, this invention is applied at the time of mounting the IC chip 72 but not limited to the embodiment. The adhesive may be applied and half cured before mounting the chip components 20, 21 or the chip components 24, 25 and thereafter these chip components may be mounted.

What is claimed is:

1. A method for manufacturing an electronic substrate including an electronic component bonded with adhesive to a base part, the method comprising:
   (a) applying a droplet containing the adhesive to an area on the base part, the area facing to the electronic component, within a range substantially equal to a size of the electronic component by using a droplet ejection head moving in relatively to the base part;
   (b) bringing the adhesive into a half-cured state;
   (c) mounting the electronic component directly onto the adhesive applied to the base part; and
   (d) bringing the adhesive into a fully-cured state by heating the base part in order to apply heat energy to the adhesive.

2. The method for manufacturing an electronic substrate according to claim 1, further comprising:
   (c) bringing the adhesive into a half-cured state before the step (b).

3. The method for manufacturing an electronic substrate according to claim 2, wherein a smaller amount of energy than that required to cure the droplet containing the adhesive is applied in the step (c), and wherein energy in the amount required to cure the droplet containing the adhesive is applied after the step (b).

4. The method for manufacturing an electronic substrate according to claim 3, wherein at least one of light energy and heat energy is applied to the droplet containing the adhesive.

5. The method for manufacturing an electronic substrate according to claim 1, wherein the base part is made from insulating material, and wherein the adhesive is defined as the insulating material.

6. The method for manufacturing an electronic substrate according to claim 1, wherein the electronic substrate includes a conductive wiring electrically connected to the electronic component, and wherein the adhesive contains material for the conductive wiring.

7. The method for manufacturing an electronic substrate according to claim 6, wherein the plurality of conductive wirings are laminated with an insulating layer intervened.

8. The method for manufacturing an electronic substrate according to claim 7, wherein the conductive wiring and the insulating layer are formed using the droplet ejection head.

\* \* \* \* \*